(12) United States Patent
Minami et al.

(10) Patent No.: US 8,545,640 B2
(45) Date of Patent: Oct. 1, 2013

(54) SUBSTRATE PROCESSING METHOD, STORAGE MEDIUM STORING COMPUTER PROGRAM FOR PERFORMING SUBSTRATE PROCESSING METHOD, AND SUBSTRATE PROCESSING APPARATUS

(75) Inventors: Teruomi Minami, Koshi (JP); Naoyuki Okamura, Koshi (JP); Yosuke Kawabuchi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 237 days.

(21) Appl. No.: 13/161,721

(22) Filed: Jun. 16, 2011

(65) Prior Publication Data
US 2011/0315169 A1 Dec. 29, 2011

(30) Foreign Application Priority Data
Jun. 23, 2010 (JP) ................................ 2010-142722

(51) Int. Cl.
*B08B 3/02* (2006.01)

(52) U.S. Cl.
USPC ............. 134/30; 134/21; 134/25.4; 134/25.5; 134/26; 134/31; 134/32; 134/33; 134/34; 134/36; 134/37; 134/42; 134/902; 216/83; 216/91; 216/92; 257/E21.224; 257/E21.228; 438/906; 510/175

(58) Field of Classification Search
USPC ................ 134/21, 25.4, 25.5, 26, 30, 31, 32, 134/33, 34, 36, 37, 42, 902; 216/83, 91, 216/92; 438/906; 257/E21.224, E21.228; 510/175
See application file for complete search history.

(56) References Cited

U.S. PATENT DOCUMENTS

| | | | |
|---|---|---|---|
| 6,261,377 B1 | 7/2001 | Mertens et al. | |
| 6,334,902 B1 | 1/2002 | Mertens et al. | |
| 7,699,939 B2 | 4/2010 | Nanba | |
| 7,806,989 B2 | 10/2010 | Sekiguchi et al. | |
| 2002/0148483 A1* | 10/2002 | Mertens et al. ................. | 134/1.3 |
| 2007/0223342 A1 | 9/2007 | Orii et al. | |
| 2009/0056764 A1 | 3/2009 | Minami et al. | |
| 2009/0205677 A1* | 8/2009 | Thakur et al. ..................... | 134/1 |
| 2009/0205684 A1* | 8/2009 | Orii et al. ......................... | 134/33 |
| 2012/0085372 A1* | 4/2012 | Plihon ............................. | 134/26 |
| 2012/0164840 A1* | 6/2012 | Tanaka et al. ................. | 438/745 |

FOREIGN PATENT DOCUMENTS

| | | |
|---|---|---|
| JP | 11-233481 A1 | 8/1999 |
| JP | 2003-197590 A1 | 7/2003 |
| JP | 2009-059895 A1 | 3/2009 |

OTHER PUBLICATIONS

U.S. Appl. No. 13/161,714, filed Jun. 16, 2011, Minami et al.

* cited by examiner

*Primary Examiner* — Bibi Carrillo
(74) *Attorney, Agent, or Firm* — Burr & Brown (57) ABSTRACT

In a substrate processing method according to the present invention, a cleaning liquid nozzle supplies a rinsing liquid to a central portion of a substrate and thereafter moves from a position corresponding to the central portion of the substrate to a position corresponding to a peripheral, edge portion thereof while supplying the rinsing liquid before stopping at the position corresponding to the peripheral edge portion. Next, a drying liquid nozzle moves from the position corresponding to the peripheral edge portion to the position corresponding to the central portion while supplying a drying liquid. Then, the drying liquid nozzle is kept stationary at the position corresponding to the central portion for a predetermined period of time while supplying the drying liquid. Thereafter, a gas nozzle moves from the position corresponding to the central portion to the position corresponding to the peripheral edge portion while supplying an inert gas.

7 Claims, 5 Drawing Sheets

SUBSTRATE PROCESSING METHOD, STORAGE MEDIUM STORING COMPUTER PROGRAM FOR PERFORMING SUBSTRATE PROCESSING METHOD, AND SUBSTRATE PROCESSING APPARATUS

CROSS-REFERENCE TO RELATED APPLICATION

This application is based upon and claims the benefit of priority from the prior Japanese Patent Application No. 2010-142722, filed on Jun. 23, 2010; the entire contents of which are incorporated herein by reference.

FIELD OF THE INVENTION

The present invention relates to a substrate processing method, a storage medium storing a computer program for performing the substrate processing method, and a substrate processing apparatus.

BACKGROUND ART

Semiconductor device fabricating processes, for example, incorporates a substrate processing apparatus that uses a spin chuck to hold a wafer (substrate) and that, while rotating the wafer, cleans the wafer by supplying a chemical liquid thereto.

When the wafer is cleaned with such a substrate processing apparatus, a chemical liquid containing an ammonia component (e.g., an ammonia-hydrogen peroxide mixture (SC1 liquid)) is first delivered to the wafer while the wafer held in the spin chuck is being rotated, to thereby clean the wafer with the SC1 liquid. A dilute hydrofluoric acid (DHF liquid) is next delivered to the wafer to perform cleaning using the DHF liquid before the wafer is rinsed with deionized water (rinsing liquid) delivered thereto. The wafer is thereafter supplied with isopropyl alcohol (IPA) for drying.

Methods for drying the wafer include, but are not limited to, spraying the wafer being rotated with, for example, the IPA in a vapor, mist, or liquid form. Another proposed method is that, while a nozzle is moved from a position corresponding to a central portion of the wafer toward a position corresponding to a peripheral edge portion thereof and deionized water is being supplied to the wafer, the IPA in a vapor form or the like is sprayed on the wafer on a side more at a center of the wafer than a position to which the deionized water is supplied (see, for example, JP 11-233481A and JP 2003-197590A).

SUMMARY OF THE INVENTION

In the above processing methods, however, particles (for example, a line-like water mark produced through precipitation of the chemical liquid or the like) may be produced on the surface of the wafer after the wafer is dried, if the wafer is highly hydrophobic. With a wafer having a large diameter, in particular, it has been difficult to inhibit particles from being produced on the peripheral edge portion of the wafer.

Another method for drying the wafer is such that, after the IPA liquid is supplied to a center of a surface of the wafer and a liquid film of the IPA liquid is formed on the surface of the wafer, the IPA liquid and the nitrogen gas are supplied to the wafer while an IPA nozzle for supplying the IPA liquid and a gas nozzle for supplying a nitrogen gas are being moved integrally from the central portion to the peripheral edge portion of the wafer, and thereby the surface of the wafer is dried. In this case, however, since the liquid film of the IPA liquid at a portion to which the nitrogen gas is supplied is thick, the IPA liquid on the wafer may be splashed by the nitrogen gas supplied to the wafer. To inhibit the IPA liquid on the wafer from being splashed by the nitrogen gas supplied to the wafer, a traveling speed of the IPA nozzle is set relatively small. This poses a problem in that the wafer drying process takes a long time and a greater amount of IPA liquid is used.

The present invention is made in view of such circumstances, and an object thereof is to provide a substrate processing method that can inhibit particles from being produced on a surface of a substrate, quickly perform a wafer drying process, and reduce an amount of a drying liquid used, a storage medium storing a computer program for performing the substrate processing method, and a substrate processing apparatus.

The present invention provides a substrate processing method A substrate processing method comprising: processing the substrate using a chemical liquid; supplying a rinsing liquid via a cleaning liquid nozzle to the substrate being rotated, after the chemical liquid process; supplying a drying liquid via a drying liquid nozzle to the substrate being rotated, after the supplying of the rinsing liquid; and supplying an inert gas via a gas nozzle to the substrate being rotated, after the supplying of the drying liquid, wherein: in the rinsing of the rinsing liquid, the cleaning liquid nozzle supplies the rinsing liquid to a central portion of the substrate, and thereafter moves from a position corresponding to the central portion of the substrate to a position corresponding to a peripheral edge portion of the substrate while supplying the rinsing liquid, before stopping at the position corresponding to the peripheral edge portion; the supplying of the drying liquid includes moving the drying liquid nozzle from the position corresponding to the peripheral edge portion of the substrate to the position corresponding to the central portion of the substrate while supplying the drying liquid; and stationary keeping the drying liquid nozzle at the position corresponding to the central portion of the substrate for a predetermined period of time while supplying the drying liquid, after the moving of the drying liquid nozzle; and in the supplying of the inert gas, the gas nozzle moves from the position corresponding to the central portion of the substrate to the position corresponding to the peripheral edge portion of the substrate while supplying the inert gas.

The present invention provides a storage medium storing a computer program for performing a substrate processing method, the substrate processing method comprising: processing the substrate using a chemical liquid; supplying a rinsing liquid via a cleaning liquid nozzle to the substrate being rotated, after the chemical liquid process; supplying a drying liquid via a drying liquid nozzle to the substrate being rotated, after the supplying of the rinsing liquid; and supplying an inert gas via a gas nozzle to the substrate being rotated, after the supplying of the drying liquid, wherein: in the rinsing of the rinsing liquid, the cleaning liquid nozzle supplies the rinsing liquid to a central portion of the substrate, and thereafter moves from a position corresponding to the central portion of the substrate to a position corresponding to a peripheral edge portion of the substrate while supplying the rinsing liquid, before stopping at the position corresponding to the peripheral edge portion; the supplying of the drying liquid includes moving the drying liquid nozzle from the position corresponding to the peripheral edge portion of the substrate to the position corresponding to the central portion of the substrate while supplying the drying liquid; and stationary keeping the drying liquid nozzle at the position corresponding to the central portion of the substrate for a predetermined period of time while supplying the drying liquid, after the moving of the drying liquid nozzle; and in the supplying of the inert gas, the gas nozzle moves from the position corresponding to the central portion of the substrate to the position corresponding to the peripheral edge portion of the substrate while supplying the inert gas.

The present invention provides a substrate apparatus A substrate processing apparatus comprising: a substrate holding unit capable of rotating, the substrate holding unit being configured to hold a substrate; a rotary driving unit configured to rotatably drive the substrate holding unit; a chemical liquid supply mechanism configured to supply the substrate held in the substrate holding unit with a chemical liquid; a rinsing liquid supply mechanism configured to supply the substrate held in the substrate holding unit with a rinsing liquid via a cleaning liquid nozzle; a drying liquid supply mechanism configured to supply the substrate held in the substrate holding unit with a drying liquid via a drying liquid nozzle; an inert gas supply mechanism configured to supply the substrate held in the substrate holding unit with an inert gas via a gas nozzle; a nozzle driving unit configured to move the cleaning liquid nozzle, the drying liquid nozzle, and the gas nozzle between a position corresponding to a central portion of the substrate and a position corresponding to a peripheral edge portion of the substrate; and a control unit configured to control the rotary driving unit, the chemical liquid supply mechanism, the rinsing liquid supply mechanism, the drying liquid supply mechanism, the inert gas supply mechanism, and the nozzle driving unit, wherein: the control unit controls the rinsing liquid supply mechanism, the drying liquid supply mechanism, the inert gas supply mechanism, and the nozzle driving unit such that, when the rinsing liquid is supplied to the substrate using the rinsing liquid supply mechanism, the cleaning liquid nozzle is stopped at the position corresponding to the central portion of the substrate while supplying the rinsing liquid, and thereafter moved from the position corresponding to the central portion of the substrate to the position corresponding to the peripheral edge portion of the substrate while supplying the rinsing liquid before being stopped at the position corresponding to the peripheral edge portion of the substrate; when the drying liquid is supplied to the substrate using the drying liquid supply mechanism, the drying liquid nozzle is moved from the position corresponding to the peripheral edge portion of the substrate to the position corresponding to the central portion of the substrate while supplying the drying liquid, and, after the drying liquid nozzle has been moved, the drying liquid nozzle is kept stationary at the position corresponding to the central portion of the substrate for a predetermined period of time while supplying the drying liquid; and, when the inert gas is supplied to the substrate using the inert gas supply mechanism, the gas nozzle is moved from the position corresponding to the central portion of the substrate to the position corresponding to the peripheral edge portion of the substrate while supplying the inert gas.

According to the present invention, particles can be inhibited from being produced on the surface of the substrate, the substrate drying process can be quickly performed, and the amount of the drying liquid used can be reduced.

DETAILED DESCRIPTION OF THE INVENTION

Embodiment of a substrate processing method, a storage medium storing a computer program for performing the substrate processing method, and a substrate processing apparatus according to the present invention described above will be described below.

In the substrate processing method according to the embodiment of the present invention, it is preferable that in the supplying of the rinsing liquid, the cleaning liquid nozzle moves after a rotating speed of the substrate is reduced to a level lower than the rotating speed of the substrate when the rinsing liquid is supplied to the central portion of the substrate.

In addition, in the substrate processing method according to the embodiment of the present invention, it is preferable that the drying liquid nozzle moves faster in the supplying of the drying liquid than the cleaning liquid nozzle does in the supplying of the rinsing liquid.

In addition, in the substrate processing method according to the embodiment of the present invention, it is preferable that in the supplying of the drying liquid, before the drying liquid nozzle is moved from the position corresponding to the peripheral edge portion of the substrate to the position corresponding to the central portion of the substrate, the rotating speed of the substrate is increased to a level higher than the rotating speed of the substrate when the cleaning liquid nozzle stops at the position corresponding to the peripheral edge portion of the substrate in the supplying of the rinsing liquid.

In addition, in the substrate processing method according to the embodiment of the present invention, it is preferable that the rotating speed of the substrate in the supplying of the inert gas is reduced to a level lower than the rotating speed of the substrate in the stationary keeping of the drying liquid nozzle of the supplying of the drying liquid.

In addition, in the substrate processing method according to the embodiment of the present invention, it is preferable that the cleaning liquid nozzle, the drying liquid nozzle, and the gas nozzle move integrally.

In the substrate processing apparatus according to the embodiment of the present invention, it is preferable that the control unit controls the rotary driving unit and the nozzle driving unit such that, when the rinsing liquid is supplied to the substrate using the rinsing liquid supply mechanism, the rotating speed of the substrate is reduced to a level lower than the rotating speed of the substrate when the cleaning liquid nozzle is stopped at the position corresponding to the central portion of the substrate, and thereafter the cleaning liquid nozzle is moved.

In addition, in the substrate processing apparatus according to the embodiment of the present invention, it is preferable that the control unit controls the nozzle driving unit such that, when the drying liquid is supplied to the substrate using the drying liquid supply mechanism, the drying liquid nozzle moves faster than the cleaning liquid nozzle does when the rinsing liquid is supplied to the substrate using the rinsing liquid supply mechanism.

In addition, in the substrate processing apparatus according to the embodiment of the present invention, it is preferable that the control unit controls the rotary driving unit such that, when the drying liquid is supplied to the substrate using the drying liquid supply mechanism, the rotating speed of the substrate is increased, before the drying liquid nozzle is moved from the position corresponding to the peripheral edge portion of the substrate to the position corresponding to the central portion of the substrate, to a level higher than the rotating speed of the substrate when the cleaning liquid nozzle supplying the rinsing liquid to the substrate stops at the position corresponding to the peripheral edge portion of the substrate.

In addition, in the substrate processing apparatus according to the embodiment of the present invention, it is preferable that the control unit controls the rotary driving unit such that, when the inert gas is supplied to the substrate using the inert gas supply mechanism, the rotating speed of the substrate is reduced to a level lower than the rotating speed of the substrate during stationary keeping the drying liquid nozzle when the drying liquid is supplied to the substrate using the drying liquid supply mechanism.

In addition, in the substrate processing apparatus according to the embodiment of the present invention, it is preferable that the cleaning liquid nozzle, the drying liquid nozzle, and the gas nozzle are connected to the nozzle driving unit via a nozzle arm and move integrally.

A substrate processing method, a storage medium storing a computer program for performing the substrate processing method, and a substrate processing apparatus according to a embodiment of the present invention will be described by referring to FIGS. 1 to 5 in detail.

A general arrangement of a substrate processing apparatus 1 will be described with reference to FIGS. 1 and 2.

Figure 1:
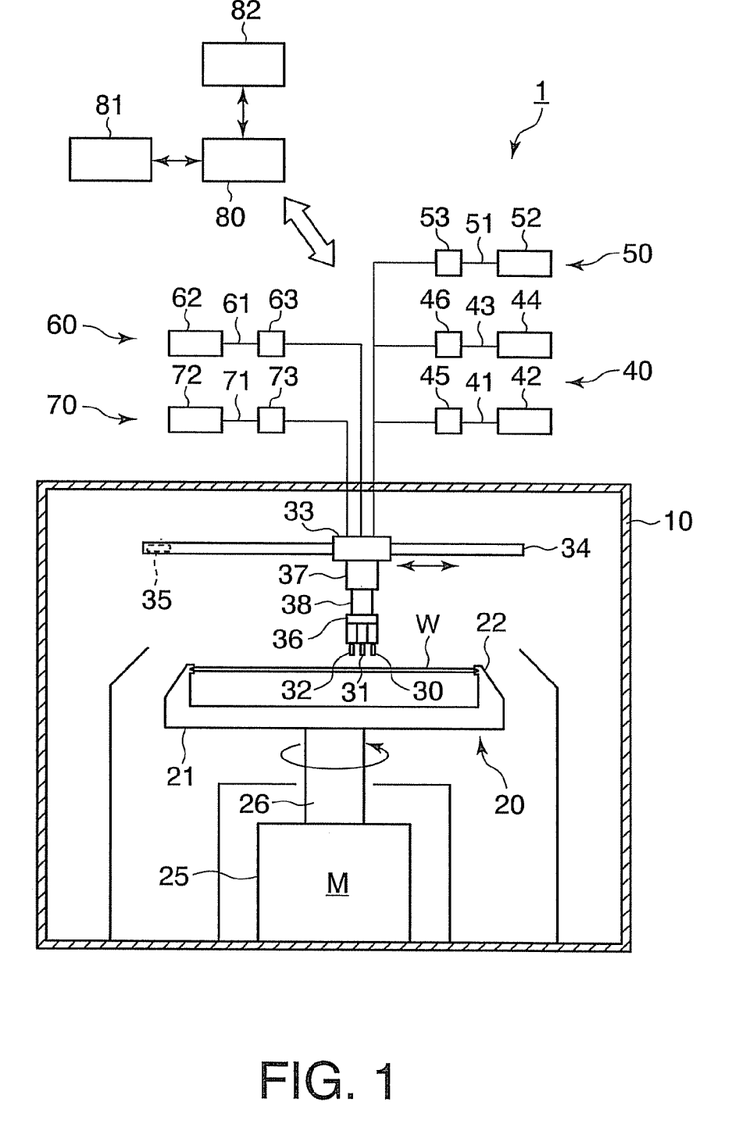
FIG. 1 is a longitudinal cross-sectional view showing a typical cross-sectional arrangement of a substrate processing apparatus according to an embodiment of the present invention.

Referring to FIG. 1, the substrate processing apparatus 1 generally includes a processing vessel 10, a spin chuck (substrate holding unit) 20 disposed in the processing vessel 10, the spin chuck 20 being capable of rotating, and a rotary driving unit (motor) 25. Specifically, the spin chuck 20 holds a substrate (e.g. a semiconductor wafer; hereinafter referred to simply as a wafer W) to be subjected to cleaning. The rotary driving unit 25 rotatably drives the spin chuck 20.

Figure 2:
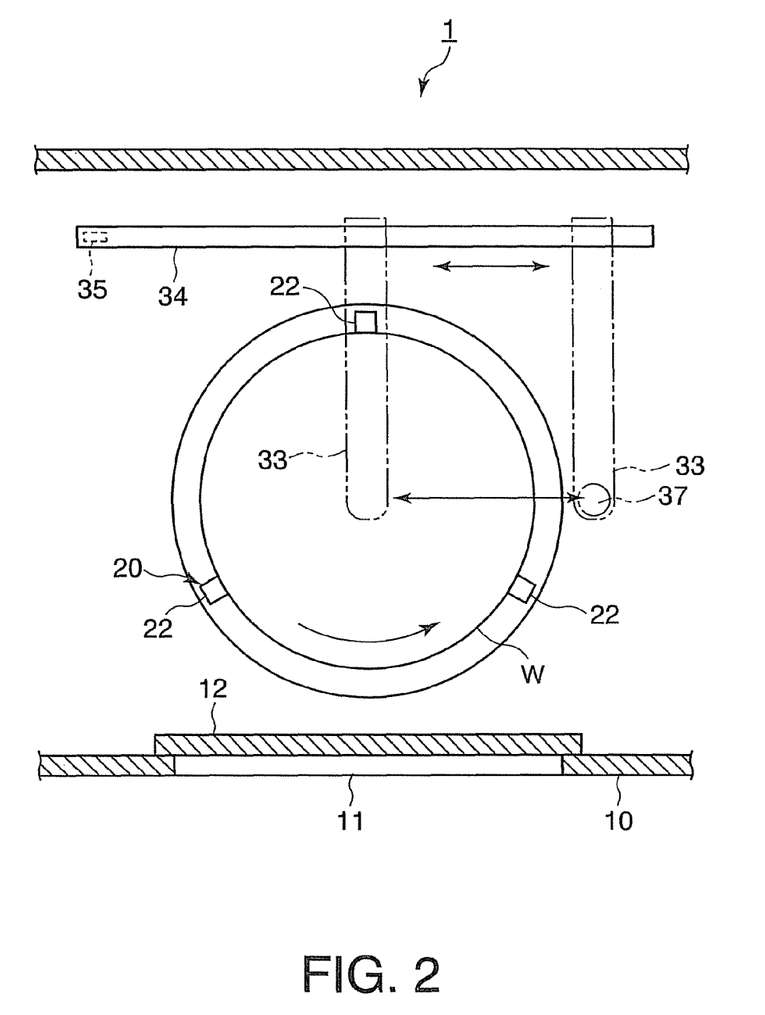
FIG. 2 is a planar cross-sectional view showing a typical cross-sectional arrangement of the substrate processing apparatus according to the embodiment of the present invention.

Referring to FIG. 2, the processing vessel 10 is provided with a loading-unloading port 11 for the wafer W. The loading-unloading port 11 is provided with an openable shutter 12 that opens during loading or unloading of the wafer W. The shutter 12 is disposed inside the processing vessel 10, thus preventing ambience in the processing vessel 10 from leaking outwardly even when pressure in the processing vessel 10 builds up. In addition, the shutter 12 is connected to a control unit 80 to be described later and adapted to be opened or closed based on a control signal from the control unit 80.

Referring to FIG. 1, the spin chuck 20 includes a rotary plate 21 and holding members 22 disposed on a peripheral edge portion of the rotary plate 21. The holding members 22 hold the wafer W in place. The holding members 22 are substantially equally spaced apart from each other on the peripheral edge portion of the rotary plate 21, being adapted to hold the wafer W in a substantially horizontal position.

The rotary driving unit 25 is connected to the rotary plate 21 of the spin chuck 20 via a rotary driving shaft 26. The rotary driving unit 25 is connected to the control unit 80. The rotary driving unit 25 is driven based on a control signal from the control unit 80 to thereby rotate the rotary plate 21, so that the wafer W held in place by the holding members 22 can rotate within a substantially horizontal plane about a center of the rotary plate 21.

Disposed upwardly of the wafer W held by the spin chuck 20 are a cleaning liquid nozzle 30, a drying liquid nozzle 31, and a gas nozzle 32. Specifically, the cleaning liquid nozzle 30 supplies the wafer W with a chemical liquid or deionized water. The drying liquid nozzle 31 supplies the wafer W with a drying liquid. The gas nozzle 32 supplies the wafer W with an inert gas. The cleaning liquid nozzle 30, the drying liquid nozzle 31, and the gas nozzle 32 are connected to a nozzle driving unit 35 via a nozzle arm 33 and a guide rail 34. The guide rail 34 is disposed substantially horizontally in the processing vessel 10. The nozzle arm 33 has a proximal end portion mounted on the guide rail 34 so as to be movable substantially horizontally along the guide rail 34. In this way, the nozzle driving unit 35 is activated, and thereby the cleaning liquid nozzle 30, the drying liquid nozzle 31, and the gas nozzle 32 are integrally moved substantially horizontally between a position corresponding to a central portion of the wafer W (a position upward of the central portion of the wafer W) and a position corresponding to a peripheral edge portion of the wafer W (a position upward of the peripheral edge portion of the wafer W) above the wafer W. Further, the cleaning liquid nozzle 30, the drying liquid nozzle 31, and the gas nozzle 32 are integrally moved also between the position corresponding to the peripheral edge portion of the wafer W and a position upward of a peripheral outward position of the wafer W (a retracted position). Additionally, the control unit 80 is connected to the nozzle driving unit 35, so that the nozzle driving unit 35 is driven based on a control signal from the control unit 80.

The cleaning liquid nozzle 30, the drying liquid nozzle 31, and the gas nozzle 32 are mounted on a connecting member 36 closely to, and in alignment with, each other. A up-down movement driving unit 37 is interposed between the connecting member 36 and a leading end portion of the nozzle arm 33. The up-down movement driving unit 37 integrally raises and lowers the cleaning liquid nozzle 30, the drying liquid nozzle 31, and the gas nozzle 32. In addition, a lift shaft 38 is connected between the connecting member 36 and the up-down movement driving unit 37. Additionally, the control unit 80 is connected to the up-down movement driving unit 37, so that the up-down movement driving unit 37 is driven based on a control signal from the control unit 80 to thereby raise or lower the cleaning liquid nozzle 30, the drying liquid nozzle 31, and the gas nozzle 32. The cleaning liquid nozzle 30, the drying liquid nozzle 31, and the gas nozzle 32 are, in this manner, adjusted for height relative to the wafer W.

The cleaning liquid nozzle 30, the drying liquid nozzle 31, and the gas nozzle 32 are disposed linearly in a radial direction of the wafer W held in the spin chuck 20 and mounted integrally on the nozzle arm 33 such that each of the nozzles 30, 31, and 32 is movable upwardly of the central portion of the wafer W.

A chemical liquid supply mechanism 40 is connected to the cleaning liquid nozzle 30, so that a chemical liquid is delivered (supplied) via the cleaning liquid nozzle 30 to the wafer W held in the spin chuck 20. The chemical liquid supply mechanism 40 according to the embodiment of the present invention includes an SC1 supply source 42 and a DHF supply source 44. The SC1 supply source 42 is connected to the cleaning liquid nozzle 30 via an SC1 supply line 41 to thereby supply the wafer W with the ammonia-hydrogen peroxide mixture (SC1 liquid). The DHF supply source 44 is connected to the cleaning liquid nozzle 30 via a DHF supply line 43 to thereby supply the wafer W with the diluted hydrofluoric acid (DHF liquid). The SC1 supply line 41 is provided with an SC1 open-close valve 45 and the DHF supply line 43 is provided with a DHF open-close valve 46. Additionally, the control unit 80 is connected to the SC1 open-close valve 45 and the DHF open-close valve 46 and each of the SC1 open-close valve 45 and the DHF open-close valve 46 is opened or closed based on a control signal from the control unit 80.

A rinsing liquid supply mechanism 50 is connected to the cleaning liquid nozzle 30, so that deionized water (rinsing liquid) is delivered (supplied) via the cleaning liquid nozzle 30 to the wafer W held in the spin chuck 20. The rinsing liquid supply mechanism 50 includes a rinsing liquid supply source 52 and a rinsing liquid open-close valve 53. The rinsing liquid supply source 52 is connected to the cleaning liquid nozzle 30 via a rinsing liquid supply line 51 to thereby supply the wafer W with the deionized water. The rinsing liquid open-close valve 53 is disposed on the rinsing liquid supply line 51. The control unit 80 is connected to the rinsing liquid open-close valve 53, so that the rinsing liquid open-close valve 53 is opened or closed based on a control signal from the control unit 80.

The SC1 supply line 41, the DHF supply line 43, and the rinsing liquid supply line 51 merge together midway position between the SC1 open-close valve 45, the DHF open-close valve 46, and the rinsing liquid open-close valve 53, respectively, and the cleaning liquid nozzle 30.

A drying liquid supply mechanism 60 is connected to the drying liquid nozzle 31, so that a drying liquid is delivered (supplied) via the drying liquid nozzle 31 to the wafer W held in the spin chuck 20. The drying liquid supply mechanism 60 includes a drying liquid supply source 62 and a drying liquid open-close valve 63. The drying liquid supply source 62 is connected to the drying liquid nozzle 31 via a drying liquid supply line 61 to thereby supply the wafer W with the drying liquid made of isopropyl alcohol (IPA) having a higher volatility than the deionized water. The drying liquid open-close valve 63 is disposed on the drying liquid supply line 61. The control unit 80 is connected to the drying liquid open-close valve 63, so that the drying liquid open-close valve 63 is opened or closed based on a control signal from the control unit 80.

An inert gas supply mechanism 70 is connected to the gas nozzle 32, so that an inert gas is delivered (supplied) via the gas nozzle 32 to the wafer W held in the spin chuck 20. The inert gas supply mechanism 70 includes a gas supply source 72 and a gas open-close valve 73. The gas supply source 72 is connected to the gas nozzle 32 via a gas supply line 71 to thereby supply the wafer W with a nitrogen gas ($N_2$ gas) as the inert gas. The gas open-close valve 73 is disposed on the gas supply line 71. The control unit 80 is connected to the gas open-close valve 73, so that the gas open-close valve 73 is opened or closed based on a control signal from the control unit 80.

As described above, the rotary driving unit 25, the nozzle driving unit 35, the SC1 open-close valve 45 and the DHF open-close valve 46 of the chemical liquid supply mechanism 40, the rising liquid open-close valve 53 of the rinsing liquid supply mechanism 50, the drying liquid open-close valve 63 of the drying liquid supply mechanism 60, and the gas open-close valve 73 of the inert gas supply mechanism 70 are connected with the control unit 80 for controlling the foregoing elements.

The control unit 80 configured as described above controls the rinsing liquid open-close valve 53 of the rinsing liquid supply mechanism 50, the drying liquid open-close valve 63 of the drying liquid supply mechanism 60, and the nozzle driving unit 35 such that, when the deionized water is supplied to the wafer W by the rinsing liquid supply mechanism 50 during a drying process to be described later, the cleaning liquid nozzle 30 is moved from the position corresponding to the central portion of the wafer W to the position corresponding to the peripheral edge portion of the wafer W; and a first process is performed in which, when the IPA liquid is supplied to the wafer W by the drying liquid supply mechanism 60, the drying liquid nozzle 31 is moved from the position corresponding to the peripheral edge portion of the wafer W to the position corresponding to the central portion of the wafer W, and a second process is performed in which, following the first process, the drying liquid nozzle 31 is kept stationary at the position corresponding to the central portion of the wafer W for a predetermined period of time. Further, the control unit 80 controls the gas open-close valve 73 of the inert gas supply mechanism 70 and the nozzle driving unit 35 such that, when the nitrogen gas is supplied to the wafer W by the inert gas supply mechanism 70, the gas nozzle 32 is moved from the position corresponding to the central portion of the wafer W to the position corresponding to the peripheral edge portion of the wafer W.

In addition, the control unit 80 controls the rotary driving unit 25 and the nozzle driving unit 35 such that, after the rotating speed of the wafer W is reduced, the cleaning liquid nozzle 30 is moved from the position corresponding to the central portion of the wafer W to the position corresponding to the peripheral edge portion of the wafer W.

Further, the control unit 80 controls the nozzle driving unit 35 such that, when the IPA liquid is supplied to the wafer W by the drying liquid supply mechanism 60, the drying liquid nozzle 31 moves faster than the cleaning liquid nozzle 30 does when the deionized water is supplied to the wafer W by the rinsing liquid supply mechanism 50.

Additionally, the control unit 80 controls the rotary driving unit 25 such that, when the IPA liquid is supplied to the wafer W by the drying liquid supply mechanism 60, the rotating speed of the wafer W is increased and, when the nitrogen gas is supplied to the wafer W by the inert gas supply mechanism 70, the rotating speed of the wafer W is reduced to a level lower than the rotating speed of the wafer W in the above-mentioned second process of supplying the IPA liquid to the wafer W by the drying liquid supply mechanism 60.

Referring to FIG. 1, the control unit 80 is connected to an input-output device 81 that may include a keyboard for performing, for example, command input operations, and a display for displaying, for example, visual operating statuses of the substrate processing apparatus 1 in order for a process manager or the like to manage the substrate processing apparatus 1. In addition, the control unit 80 is capable of accessing a storage medium 82 on which, for example, a program for realizing processes performed by the substrate processing apparatus 1 is stored. The storage medium 82 may be composed of a well-known storage medium, such as ROM, RAM, or other form of memory, hard disks, CD-ROM, DVD-ROM, and flexible disks or other disk-like storage medium. Thus, the control unit 80 performs the program previously stored in the storage medium 82, which results in the substrate processing apparatus 1 processing the wafer W.

Next, the operation of the embodiment of the present invention as described above, specifically, a substrate processing method according to the embodiment of the present invention will be described below. Operation of each component for performing the substrate processing method to be described hereunder is controlled by a control signal from the control unit 80 based on a program previously stored in the storage medium 82.

Figure 3:
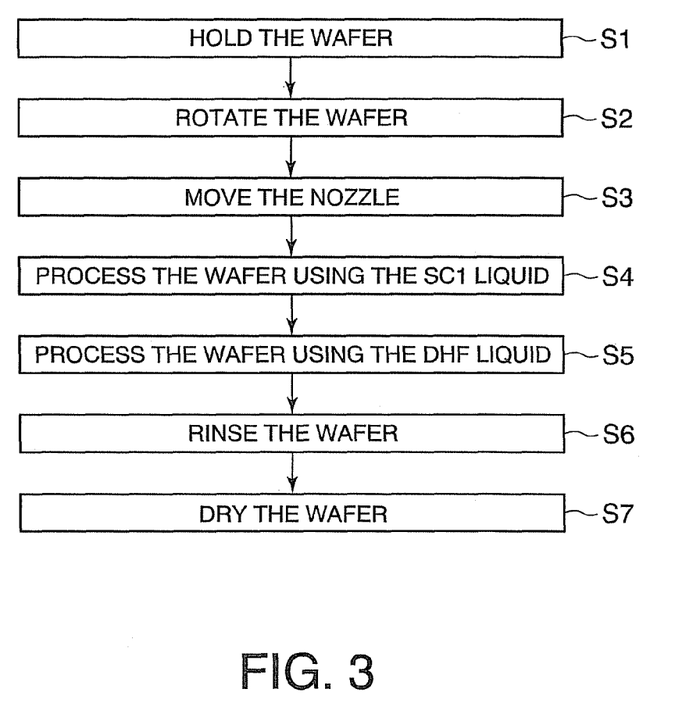
FIG. 3 is a flow chart showing a substrate processing method according to the embodiment of the present invention.

First of all, referring to FIG. 3, the wafer W is held in the spin chuck 20 (step S1). In this case, the shutter 12 is first opened and the wafer W held in place by a transfer arm not shown is loaded into the processing vessel 10 through the loading-unloading port 11. Next, the transfer arm unloads the wafer W, so that the holding members 22 of the spin chuck 20 can hold the wafer W.

The rotary driving unit 25 then rotatably drives the spin chuck 20 that holds the wafer W (step S2).

The nozzle driving unit 35 is thereafter activated, so that the cleaning liquid nozzle 30 located at the retracted position moves to the position corresponding to the central portion of the wafer W held in the spin chuck 20 (step S3).

The wafer W is next subjected to processing using a chemical liquid while being rotated.

In this case, an SC1 liquid is first supplied to a surface of the wafer W to thereby process and clean the surface of the wafer W with the SC1 liquid (step S4). Specifically, the SC1 open-close valve 45 opens to allow the SC1 liquid to be delivered from the SC1 supply source 42 onto the central portion of the surface of the wafer W via the SC1 supply line 41 and the cleaning liquid nozzle 30. This results in the delivered SC1 liquid spreading over an entire surface of the wafer W because of a centrifugal force involved, so that a liquid film of the SC1 liquid is formed on the surface of the wafer W. Preferably, the rotating speed of the wafer W is set at this time to, for example, about 10 to 500 rpm. After the liquid film of the SC1 liquid is formed, the SC1 open-close valve 45 is closed to stop the supply of the SC1 liquid and the wafer W is allowed to stand for a predetermined period of time. This allows the SC1 liquid to be displaced outwardly of the wafer W by the centrifugal force.

Following the cleaning using the SC1 liquid, a DHF liquid is supplied to the surface of the wafer W, so that the surface of the wafer W can be processed and cleaned with the DHF liquid (step S5). Specifically, the DHF open-close valve 46 opens to allow the DHF liquid to be delivered from the DHF supply source 44 onto the central portion of the surface of the wafer W via the DHF supply line 43 and the cleaning liquid nozzle 30. This results in the delivered DHF liquid spreading over the entire surface of the wafer W because of the centrifugal force involved, so that a liquid film of the DHF liquid is formed on the surface of the wafer W. Preferably, the rotating speed of the wafer W is set at this time to, for example, about 10 to 500 rpm. After the liquid film of the DHF liquid is formed, the DHF open-close valve 46 is closed to stop the supply of the DHF liquid and the wafer W is allowed to stand for a predetermined period of time. This allows the DHF liquid to be displaced outwardly of the wafer W by the centrifugal force.

After the processing using the chemical liquids, the wafer W is subjected to rinsing while being rotated (rinsing process, step S6). Specifically, the rinsing liquid open-close valve 53 opens to allow the deionized water to be delivered from the rinsing liquid supply source 52 onto the central portion of the surface of the wafer W via the rinsing liquid supply line 51 and the cleaning liquid nozzle 30. This results in the delivered deionized water spreading over the entire surface of the wafer W because of the centrifugal force involved to thereby wash away the chemical liquid left on the surface of the wafer W, so that a liquid film of the deionized water is formed on the surface of the wafer W. Preferably, the rotating speed of the wafer W is set at this time to, for example, about 500 to 1500 rpm. This allows the chemical liquid to be quickly washed away from the surface of the wafer W to thereby form the liquid film of the deionized water. At the end of the rinsing process, a thick liquid film of the deionized water with a residual chemical liquid is formed on the surface of the wafer W. The term "thick liquid film" as used herein means that the liquid film is thicker than that at the end of a slow dry step (step S7-1) to be described later.

Figure 4:
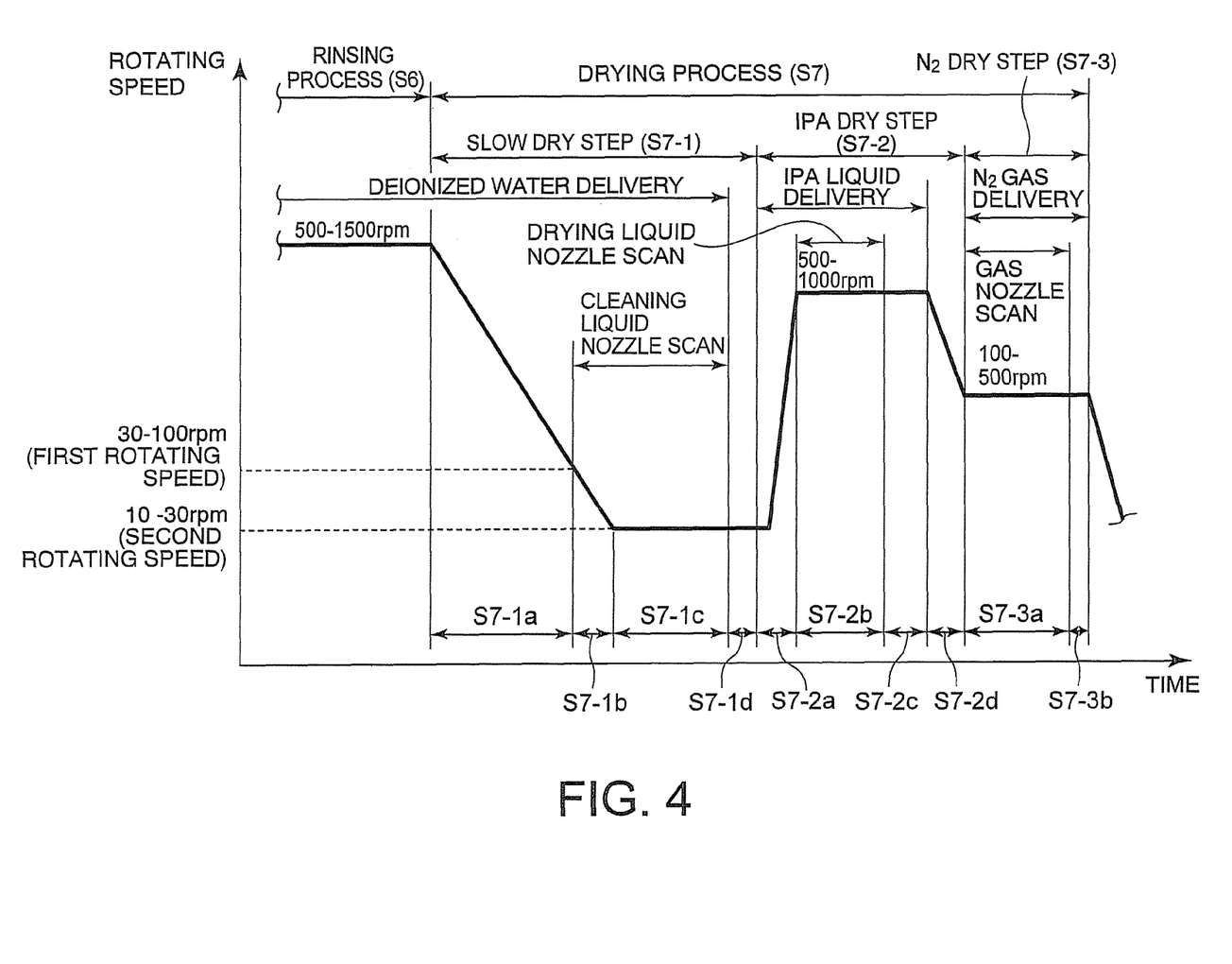
FIG. 4 is a diagram showing changes in a rotating speed of a substrate in the substrate processing method according to the embodiment of the present invention.

After the rinsing process, the wafer W is subjected to drying (step S7). Referring to FIG. 4, the drying process generally includes a slow dry step (step S7-1), an IPA dry step (step S7-2), and an $N_2$ dry step (step S7-3). Specifically, in the slow dry step, while the deionized water is delivered onto the wafer W, the rotating speed of the wafer W is reduced to a level lower than that in the rinsing process. In the IPA dry step, the IPA liquid is delivered onto the wafer W. In the $N_2$ dry step, the nitrogen gas are delivered onto the wafer W.

First, the rotating speed of the wafer W is reduced, while the deionized water is being delivered onto the central portion of the wafer W which has undergone the rinsing process (step S7-1a).

Figure 5:
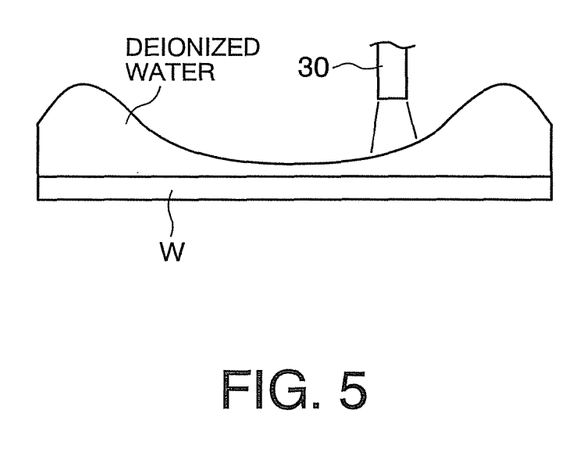
FIG. 5 is an illustration showing a condition of a rinsing liquid during rinsing process in the substrate processing method according to the embodiment of the present invention.

After the rotating speed of the wafer W is reduced to the first rotating speed (30 to 100 rpm), the cleaning liquid nozzle 30 is moved (made to scan) by the nozzle driving unit 35 from the position corresponding to the central portion of the wafer W toward the position corresponding to the peripheral edge portion thereof, while the deionized water is being delivered. This allows a good part of the deionized water to be moved from the central portion of the wafer W toward the peripheral edge portion thereof as the cleaning liquid nozzle 30 moves, as shown in FIG. 5. Following the start of the scan motion of the cleaning liquid nozzle 30, the rotating speed of the wafer W is further reduced for a period of time until the cleaning liquid nozzle 30 reaches a predetermined midway position between the central portion and the peripheral edge portion of the wafer W (step S7-1b). This prevents the deionized water delivered onto the wafer W from splashing against, for example, the holding members 22 of the spin chuck 20 since the rotating speed of the wafer W is reduced as the cleaning liquid nozzle 30 reaches the position corresponding to the peripheral edge portion of the wafer W.

Referring to FIG. 4, the rotating speed of the wafer W is reduced to the second rotating speed (10 to 30 rpm) that is lower than the first rotating speed and is then maintained at the second rotating speed (step S7-1c). During this time, the cleaning liquid nozzle 30 keeps moving to the position corresponding to the peripheral edge portion of the wafer W, while the deionized water is being delivered.

Thereafter, the cleaning liquid nozzle 30 reaches and stops at the position corresponding to the peripheral edge portion of the wafer W and the rising liquid open-close valve 53 is closed to thereby stop the supply of the deionized water for the wafer W. The rotating speed of the wafer W is maintained at the second rotating speed for a predetermined period of time (step S7-1d). This allows a good part of the deionized water collected at the peripheral edge portion of the wafer W to be displaced outwardly of the peripheral edge of the wafer W. Even in this case, a thin liquid film of the deionized water is still left on the entire surface of the wafer W by surface tension. Specifically, most of the deionized water containing the ammonium fluoride can be effectively displaced outwardly of the peripheral edge of the wafer W from the surface of the wafer W, while the thin liquid film is left behind. Consequently, even when after this the wafer W is supplied with the IPA liquid to be thereby subjected to the drying process, particles can be inhibited from being produced from the ammonium fluoride or the like. As a result, particles can be inhibited from being produced on the surface of the wafer W. The term "thin liquid film" as used herein means that the liquid film is thinner than that at the end of the rising process (step S6) described earlier.

An IPA dry step (S7-2) is next performed.

In this case, the drying liquid open-close valve 63 opens and the IPA liquid is delivered from the drying liquid supply source 62 onto the peripheral edge portion on the surface of the wafer W via the drying liquid supply line 61 and the drying liquid nozzle 31. After the IPA liquid is delivered, the rotating speed of the wafer W is increased from the second rotating speed (step S7-2a).

After the rotating speed of the wafer W reaches a third rotating speed (500 to 1000 rpm), the drying liquid nozzle 31 moves (scans) from the position corresponding to the peripheral edge portion of the wafer W to the position corresponding to the central portion of the wafer W (step S7-2b, the first process). At this time, the drying liquid nozzle 31 moves faster than the cleaning liquid nozzle 30 does in the slow dry step (S7-1). Additionally, the drying liquid nozzle 31 starts a scan motion from the position corresponding to the peripheral edge portion of the wafer W, without moving to the position corresponding to the central portion of the wafer W after the slow dry step (S7-1). This allows the deionized water left on the surface of the wafer W to be quickly replaced by the IPA liquid. In addition, since the amount of deionized water left on the surface of the wafer W is small, the deionized water can be quickly replaced by the IPA liquid. Particles can thereby be inhibited from being produced on the surface of the wafer W. Additionally, as described above, since the liquid film of the deionized water left on the surface of the wafer W is thin, the amount of IPA liquid required for the replacement of the deionized water can be reduced. While the drying liquid nozzle 31 is scanning, the rotating speed of the wafer W is maintained constantly at the third rotating speed.

When the drying liquid nozzle 31 reaches to the position corresponding to the central portion of the wafer W and is then stationary thereat, the rotating speed of the wafer W is maintained at the third rotating speed in the abovementioned step S7-2b for a predetermined period of time (step S7-2c, the second process). The rotating speed of the wafer W, being higher than the second rotating speed, allows the IPA liquid to be quickly supplied onto the entire surface of the wafer W.

After this, the drying liquid open-close valve 63 is closed to thereby stop the supply of the IPA liquid to the wafer W, and the rotating speed of the wafer W is reduced (step S7-2d).

Next, after the rotating speed of the wafer W reaches a fourth rotating speed (100 to 500 rpm), the $N_2$ dry step (S7-3) is performed. Specifically, the gas open-close valve 73 opens and the nitrogen gas is delivered onto the surface of the wafer W from the gas supply source 72 via the gas supply line 71 and the gas nozzle 32. At the same time, the gas nozzle 32 moves (scans) from the position corresponding to the central portion of the wafer W toward the position corresponding to the peripheral edge portion of the wafer W (step S7-3a). The gas nozzle 32 thereafter reaches the position corresponding to the peripheral edge portion of the wafer W, where the gas nozzle 32 is left stationary, so that the nitrogen gas is delivered for a predetermined period of time (step S7-3b). This allows the IPA liquid left on the peripheral edge portion of the wafer W to be surely removed, so that the peripheral edge portion of the wafer W can be dried. In addition, in the $N_2$ dry step (S7-3), the rotating speed of the wafer W is maintained constantly at the fourth rotating speed. Since the rotating speed of the wafer W is reduced to a level lower than the third rotating speed during the IPA dry step (S7-2), the IPA liquid can be prevented from being partly displaced outwardly of the peripheral edge from the surface of the wafer W through the rotating force before the nitrogen gas is delivered. As a result, in the $N_2$ dry step (S7-3), the IPA liquid is removed from the central portion toward the peripheral edge portion of the wafer W to thereby allow the peripheral edge portion of the wafer W to be dried.

The drying process for the wafer W is thus completed. Thereafter, the rotating speed of the wafer W is reduced and the wafer W is brought to a stop. Then, by reversing the order of loading of the wafer W, the transfer arm not shown is inserted downwardly of the wafer W, and the wafer W is transferred onto the transfer arm and unloaded.

According to the embodiment of the present invention, the IPA liquid is supplied to the wafer W, while the drying liquid nozzle 31 that has been located at the position corresponding to the peripheral edge portion of the wafer W at the end of the slow dry step (S7-1) using the rinsing liquid is moved therefrom to the position corresponding to the central portion of the wafer W. This shortens the time it takes to start supplying the IPA liquid to the deionized water left on the surface of the wafer W; not only that, but it also allows the IPA liquid to be quickly supplied to the entire surface of the wafer W, so that the deionized water on the surface of the wafer W can be quickly replaced by the IPA liquid. Further, while the drying liquid nozzle 31 that has reached the position corresponding to the central portion of the wafer W is kept stationary thereat, the IPA liquid is delivered onto the central portion of the wafer W for a predetermined period of time. This allows a sufficient amount of IPA liquid that is required for replacing the deionized water on the surface of the wafer W to be supplied throughout the entire surface of the wafer W. As a result, particles can be inhibited from being produced on the surface of the wafer W and the drying process for the wafer W can be performed quickly.

Additionally, according to the embodiment of the present invention, the nitrogen gas is supplied to the surface of the wafer W after the IPA liquid is supplied thereto, to thereby dry the IPA liquid on the surface of the wafer W. In this case, since a sufficient amount of IPA liquid is left on the surface of the wafer W, there is no need to supply the IPA liquid during the supply of the nitrogen gas. This helps reduce the amount of IPA liquid used.

Additionally, according to the embodiment of the present invention, after the IPA dry step (S7-2), the nitrogen gas is supplied to the wafer W, while the gas nozzle 32 is made to scan ($N_2$ dry step (S7-3)). This allows the IPA liquid left on the surface of the wafer W to be quickly dried. Particularly, since no IPA liquid is supplied during the supply of the nitrogen gas, the liquid film of the IPA liquid can be made thin, which prevents the IPA liquid on the wafer W from being splashed by the nitrogen gas supplied to the wafer W. A scanning speed of the gas nozzle 32 can therefore be set high during the supply of the nitrogen gas, thereby contributing to a shorter time required for the drying process.

Additionally, according to the embodiment of the present invention, the rotating speed of the wafer W is reduced and, after the rotating speed of the wafer W is reduced to the first rotating speed, the wafer W is supplied with the deionized water while the rinsing liquid supply position at which the wafer W is supplied with the deionized water is being moved from the central portion of the wafer W toward the peripheral edge portion thereof. This allows a good part of the deionized water existing on the surface of the wafer W and containing the ammonium fluoride to be displaced outwardly of the peripheral edge of the wafer W, while leaving behind a thin liquid film. The amount of deionized water left on the surface of the wafer W can therefore be reduced and the amount of IPA liquid required for the replacement of the deionized water can be reduced. In addition, particles can be inhibited from being produced from the ammonium fluoride or the like. As a result, particles can be inhibited from being produced on the surface of the wafer W.

While the embodiments of the present invention have been described and illustrated above, those may be, of course, modified into various forms within the scope of the concept of the present invention. Hereinafter, representative modified examples will be described.

In the embodiment of the present invention, in the IPA dry step (S7-2), the rotating speed of the wafer W is increased to 500 to 1000 rpm, and thereafter the drying liquid nozzle 31 is made to scan from the position corresponding to the peripheral edge portion of the wafer W to the position corresponding to the central portion of the wafer W. However, not limited thereto, the drying liquid nozzle 31 may be made to start scanning from the position corresponding to the peripheral edge portion of the wafer W to the position corresponding to the central portion of the wafer W while the rotating speed of the wafer W is being increased toward 500 to 1000 rpm. In such a case, the IPA liquid can be supplied to the entire surface of the wafer W even more quickly, so that the deionized water can be replaced by the IPA liquid even more quickly.

In the embodiment of the present invention, the rinsing liquid supply position is moved from the central portion of the wafer W toward the peripheral edge portion thereof after the rotating speed of the wafer W is reduced to the first rotating speed, and thereafter the rotating speed of the wafer W is further reduced. However, not limited thereto, after the rotating speed of the wafer W is reduced to the first rotating speed (e.g. 30 to 100 rpm), the rotating speed of the wafer W may be maintained at the first rotating speed, while the rinsing liquid supply position is being moved from the central portion of the wafer W toward the peripheral edge portion thereof. Specifically, in step S7-1b in the rinsing process shown in FIG. 4, the cleaning liquid nozzle 30 is stopped at the position corresponding to the central portion of the wafer W and, in step S7-1c, the cleaning liquid nozzle 30 is moved from the position corresponding to the central portion of the wafer W to the position corresponding to the peripheral edge portion of the wafer W. This allows a good part of the deionized water on the surface of the wafer W to be moved from the central portion of the wafer W toward the peripheral edge portion thereof and eventually displaced outwardly of the peripheral edge of the wafer W, as the cleaning liquid nozzle 30 is moved.

In addition, in the embodiment of the present invention described above, the wafer W is subjected to the chemical liquid cleaning using the SC1 liquid and the DHF liquid. These are, however, not the only possible chemical liquids used for the chemical liquid cleaning and any type of chemical liquid may be used.

In the embodiment of the present invention, following the cleaning using the SC1 liquid, the DHF liquid is delivered onto the wafer W to perform the cleaning using the DHF liquid. However, not limited thereto, following the cleaning using the SC1 liquid, the deionized water may be delivered onto the surface of the wafer W to thereby rinse the surface of the wafer W; thereafter, the cleaning using the DHF liquid may be performed.

In the embodiment of the present invention, the deionized water is used as the rinsing liquid. The deionized water is not, however, the only possible option to be used as the rinsing liquid.

In the embodiment of the present invention, the IPA liquid is used as the drying liquid. The IPA liquid is not, however, the only possible option to be used as the drying liquid. In addition, the IPA liquid to be delivered onto the wafer W is not limited to a liquid form. Alternatively, the IPA liquid may be in a mist form or a jet form. Further, the wafer W may be supplied with a heated IPA liquid. In this case, vaporization of the IPA liquid may be promoted.

The description given heretofore exemplifies the substrate processing method, the storage medium storing a computer program for performing the substrate processing method, and the substrate processing apparatus according to the present invention as applied to cleaning processes of the semiconductor wafer W. However, the present invention may nonetheless be applied to cleaning of various other types of substrates including an LCD substrate and a CD substrate.

The invention claimed is:

1. A substrate processing method comprising:
   processing the substrate using a chemical liquid;
   rinsing the substrate by supplying a rinsing liquid via a cleaning liquid nozzle to the substrate being rotated, after the chemical liquid process;
   supplying a drying liquid via a drying liquid nozzle to the substrate being rotated, after the supplying of the rinsing liquid; and
   supplying an inert gas via a gas nozzle to the substrate being rotated, after the supplying of the drying liquid,
   wherein: in the rinsing by the rinsing liquid, the cleaning liquid nozzle supplies the rinsing liquid to a central portion of the substrate, and thereafter moves from a position corresponding to the central portion of the substrate to a position corresponding to a peripheral edge portion of the substrate while supplying the rinsing liquid, before stopping at the position corresponding to the peripheral edge portion;
   the supplying of the drying liquid includes moving the drying liquid nozzle from the position corresponding to the peripheral edge portion of the substrate to the position corresponding to the central portion of the substrate while supplying the drying liquid; and keeping the drying liquid nozzle stationary at the position corresponding to the central portion of the substrate for a predetermined period of time while supplying the drying liquid, after moving the drying liquid nozzle from the peripheral edge portion to the central portion; and
   in the supplying of the inert gas, the gas nozzle moves from the position corresponding to the central portion of the substrate to the position corresponding to the peripheral edge portion of the substrate while supplying the inert gas.

2. The substrate processing method according to claim 1, wherein: in the supplying of the rinsing liquid, the cleaning liquid nozzle moves from the central portion after a rotating speed of the substrate is reduced to a level lower than a rotating speed of the substrate when the rinsing liquid is supplied to the central portion of the substrate.

3. The substrate processing method according to claim 1, wherein: the drying liquid nozzle moves faster in the supplying of the drying liquid than the cleaning liquid nozzle does in the supplying of the rinsing liquid.

4. The substrate processing method according to claim 1, wherein: in the supplying of the drying liquid, before the drying liquid nozzle is moved from the position corresponding to the peripheral edge portion of the substrate to the position corresponding to the central portion of the substrate, a rotating speed of the substrate is increased to a level higher than a rotating speed of the substrate when the cleaning liquid nozzle stops at the position corresponding to the peripheral edge portion of the substrate in the supplying of the rinsing liquid.

5. The substrate processing method according to claim 1, wherein: a rotating speed of the substrate in the supplying of the inert gas is reduced to a level lower than a rotating speed of the substrate when the drying liquid nozzle supplying the drying liquid is stationary at the central portion.

6. The substrate processing method according to claim 1, wherein: the cleaning liquid nozzle, the drying liquid nozzle, and the gas nozzle move intergrally.

7. A storage medium stored a computer program for performing a substrate processing method, the substrate processing method comprising:

processing the substrate using a chemical liquid;

rinsing the substrate by supplying a rinsing liquid via a cleaning liquid nozzle to the substrate being rotated, after the chemical liquid process;

supplying a drying liquid via a drying liquid nozzle to the substrate being rotated, after the supplying of the rinsing liquid; and supplying an inert gas via a gas nozzle to the substrate being rotated, after the supplying of the drying liquid, wherein: in the rinsing by the rinsing liquid, the cleaning liquid nozzle supplies the rinsing liquid to a central portion of the substrate, and thereafter moves from a position corresponding to the central portion of the substrate to a position corresponding to a peripheral edge portion of the substrate while supplying the rinsing liquid, before stopping at the position corresponding to the peripheral edge portion;

the supplying of the drying liquid includes moving the drying liquid nozzle from the position corresponding to the peripheral edge portion of the substrate to the position corresponding to the central portion of the substrate while supplying the drying liquid; and keeping the drying liquid nozzle stationary at the position corresponding to the central portion of the substrate for a predetermined period of time while supplying the drying liquid, after moving the drying liquid nozzle from the peripheral portion to the central portion; and in the supplying of the inert gas, the gas nozzle moves from the position corresponding to the central portion of the substrate to the position corresponding to the peripheral edge portion of the substrate while supplying the inert gas.

* * * * *